United States Patent
Kim et al.

(10) Patent No.: US 10,942,594 B2
(45) Date of Patent: Mar. 9, 2021

(54) INTEGRATED ELECTROACTIVE AND CAPACITIVE TOUCH PANEL AND DISPLAY DEVICE INCLUDING THE SAME

(71) Applicant: LG Display Co., Ltd., Seoul (KR)

(72) Inventors: Chiwan Kim, Goyang-si (KR); Taeheon Kim, Seoul (KR); Sung-Eui Shin, Seoul (KR); YongWoo Lee, Goyang-si (KR); Kyungyeol Ryu, Goyang-si (KR); YuSeon Kho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/201,793

(22) Filed: Nov. 27, 2018

(65) Prior Publication Data
US 2019/0163314 A1     May 30, 2019

(30) Foreign Application Priority Data

Nov. 29, 2017   (KR) .......................... 10-2017-0161988

(51) Int. Cl.
*G06F 3/041*     (2006.01)
*G06F 3/044*     (2006.01)
(Continued)

(52) U.S. Cl.
CPC ............ *G06F 3/0416* (2013.01); *G06F 3/044* (2013.01); *G06F 3/0412* (2013.01);
(Continued)

(58) Field of Classification Search
CPC ...... G06F 3/0416; G06F 3/0412; G06F 3/044; G06F 2203/04105; G06F 2203/04111; G02F 1/13338
See application file for complete search history.

(56) References Cited

U.S. PATENT DOCUMENTS 9,417,725 B1     8/2016  Watazu et al.
2015/0193055 A1  7/2015  Ando
(Continued)

FOREIGN PATENT DOCUMENTS

EP  2 899 615 A1   7/2015
EP     2899615  *  7/2015
(Continued)

OTHER PUBLICATIONS

European Patent Office, Extended European Search Report and Opinion, EP Patent Application No. 18208640.5, dated Feb. 19, 2019, eight pages.

(Continued)

*Primary Examiner* — Lisa S Landis
(74) *Attorney, Agent, or Firm* — Fenwick & West LLP

(57) ABSTRACT

A touch panel includes a plurality of first electrodes which extends in a first direction. The touch panel further includes an electroactive layer which is disposed on the plurality of first electrodes and is formed of an electroactive material. The touch panel further includes a plurality of second electrodes which is disposed on the electroactive layer and extends in a second direction which is different from the first direction. The touch panel further includes an insulating layer which is disposed to cover the electroactive layer and the plurality of second electrodes. The touch panel further includes a plurality of third electrodes which is disposed on the insulating layer and extends in the second direction.

17 Claims, 8 Drawing Sheets

(51) Int. Cl.
    *G02F 1/1333* (2006.01)
    *H01L 27/32* (2006.01)
(52) U.S. Cl.
    CPC .............. *G02F 1/13338* (2013.01); *G06F 2203/04105* (2013.01); *G06F 2203/04111* (2013.01); *H01L 27/323* (2013.01)

(56) References Cited

U.S. PATENT DOCUMENTS

| | | |
|---|---|---|
| 2015/0268802 A1 | 9/2015 | Kim et al. |
| 2016/0117034 A1* | 4/2016 | Day ................ G06F 3/0416 345/174 |
| 2016/0179229 A1* | 6/2016 | Ahn ................ H01L 27/323 345/173 |
| 2016/0231849 A1 | 8/2016 | Watazu et al. |
| 2017/0262099 A1* | 9/2017 | Nathan ............ G06F 3/0414 |
| 2018/0107300 A1* | 4/2018 | Lin ................ G02F 1/134336 |

FOREIGN PATENT DOCUMENTS

| | | |
|---|---|---|
| JP | 2015-005231 A | 1/2015 |
| JP | 2015-097068 A | 5/2015 |
| JP | 2015-185161 A | 10/2015 |
| KR | 10-2016-0076033 A | 6/2016 |
| WO | WO 2014/045847 A1 | 3/2014 |

OTHER PUBLICATIONS

Japan Patent Office, Notice of Reasons for Rejection, JP Patent Application No. 2018-222634, dated Jan. 7, 2020, six pages.

* cited by examiner

INTEGRATED ELECTROACTIVE AND CAPACITIVE TOUCH PANEL AND DISPLAY DEVICE INCLUDING THE SAME

CROSS-REFERENCE TO RELATED APPLICATIONS

This application claims priority to Republic of Korea Patent Application No. 10-2017-0161988 filed on Nov. 29, 2017, in the Korean Intellectual Property Office, the disclosure of which is incorporated herein by reference in its entirety.

BACKGROUND

Field

The present disclosure relates to a touch panel and a display device including the same. In particular, it relates to a touch panel which senses a touch position, a touch force, and a change in a touch force through one touch panel and a display device including the same.

Description of the Related Art

A touch panel is a device which senses a touch input of a user, such as a touch on a screen of a display device or a gesture, and is widely utilized in portable display devices such as smart phones and tablet PCs, as well as in large-size display devices such as display devices of public facilities and smart TVs.

Recently, demands on touch panels which sense various touch inputs are increasing. Therefore, touch panels which apply not only a touch sensor which has been mainly applied in the related art to sense a position of a touch input, but also a force sensor which measures an intensity of a touch input are actively being studied. Generally, the force sensor is divided into a resistive type and a capacitive type.

The resistive type force sensor measures a change in resistance between a conductive material and an electrode according to an applied pressure to detect a touch force. The resistive type force sensor has a simple process and a simple structure, but lacks precision and is inappropriate to be integrated with a touch sensor.

The capacitive type force sensor recognizes a change in capacitance according to a change in an interval of upper and lower electrodes by a pressure to detect a touch force. The capacitive type force sensor may be configured to be transparent and have excellent sensitivity and may easily process signals. However, a thickness of an insulating layer needs to be sufficient to sufficiently sense a change in capacitance by upper and lower electrodes which configure the force sensor. Therefore, there is a disadvantage in that the thickness of a device needs to be increased and an area of a unit cell needs to be large.

In the meantime, in order to measure both a position and a force of the touch input in the display device, generally, a touch position sensor and a force sensor are separately provided. In this case, two sensors are applied to the display device so that a thickness is increased and a sensor manufacturing process and a display device manufacturing process become complex.

SUMMARY

An object to be achieved by the present disclosure is to provide a touch panel which senses not only the touch position and the touch force, but also a change in a touch force by integrally forming a piezoelectric type touch sensor and a capacitive type touch sensor and a display device including the same.

Another object to be achieved by the present disclosure is to provide a touch panel in which different types of touch sensors are integrally formed to reduce a thickness and simplify a manufacturing process and a display device including the same.

Still another object to be achieved by the present disclosure is to provide a touch panel which provides a transparent touch panel having flexibility to be applicable to an organic light emitting display panel and a flexible display panel and a display device including the same.

Objects of the present disclosure are not limited to the above-mentioned objects, and other objects, which are not mentioned above, can be clearly understood by those skilled in the art from the following descriptions.

Embodiments of the present disclosure relate to a touch panel including an electroactive layer, a plurality of driving electrodes on one side of the electroactive layer, the driving electrodes configured to transmit a driving signal, a plurality of first sensing electrodes on another side of the electroactive layer, the first sensing electrodes transmitting voltage signals generated responsive to deformation of the electroactive layer, and a plurality of second sensing electrodes on the other side of the electroactive layer. The second sensing electrodes are spaced apart from the plurality of first sensing electrodes and the plurality of driving electrodes. The second sensing electrodes transmit capacitance signals indicating a change in capacitance between the driving electrodes and the sensing electrodes.

In one embodiment, each of the plurality of second sensing electrodes overlaps at least one of the plurality of first sensing electrodes.

In one embodiment, an area of each of the plurality of first sensing electrodes is smaller than an area of each of the plurality of second sensing electrodes.

In one embodiment, each of the plurality of first sensing electrodes includes a plurality of sub electrodes overlapping the plurality of driving electrodes and a bridge electrode which connects the plurality of sub electrodes.

In one embodiment, the sub electrodes have a circular shape or a polygonal shape.

In one embodiment, an insulating layer is disposed between the plurality of first sensing electrodes and the plurality of second sensing electrodes.

In one embodiment, the voltage signals are processed to determine touch positions and touch forces on the touch panel.

In one embodiment, a first read-out integrated circuit (IC), connected to the plurality of first sensing electrodes, detects a touch position and a touch force by processing the voltage signals. Additionally, a second read-out IC, connected to the plurality of second sensing electrodes, processes the capacitance signals to sense a change in the touch force.

In one embodiment, the driving signal is applied during a touch sensing period. The touch position, the touch force, and the change in the touch force are simultaneously detected by the first read-out IC and the second read-out IC during the touch sensing period.

In one embodiment, the driving signal is applied during a touch sensing period. The touch position and the touch force are detected by the first read-out IC during a first touch sensing period of the touch sensing period, and the change in the touch force is detected by the second read-out IC during a second touch sensing period different from the first touch sensing period.

In one embodiment, the plurality of driving electrodes extends in a first direction, and the plurality of first sensing electrodes and the plurality of second sensing electrodes extend in a second direction different from the first direction.

Embodiments of the present disclosure also relate to a display device, including a display panel and a touch panel disposed above or below the display panel. The touch panel includes an electroactive layer, a plurality of driving electrodes on one side of the electroactive layer, the driving electrodes transmit a driving signal, a plurality of first sensing electrodes disposed on another side of the electroactive layer, the first sensing electrodes transmit voltage signals generated responsive to deformation of the electroactive layer and a plurality of second sensing electrodes disposed on the electroactive layer. The second sensing electrodes are spaced apart from the plurality of first sensing electrodes and the plurality of driving electrodes. The second sensing electrodes transmit capacitance signals indicating a change in capacitance between the driving electrodes and the second sensing electrodes.

In one embodiment, a buffer layer is provided between the display panel and the touch panel. The display panel includes an organic light emitting diode and an encapsulation unit on the organic light emitting diode, and the touch panel is disposed on the buffer layer.

Embodiments of the present disclosure relates to operating a touch panel. A driving signal is provided through a plurality of driving electrodes disposed on one side of an electroactive layer. Voltage signals are transmitted through a plurality of first sensing electrodes on another side of the electroactive layer. The voltage signals indicate a deformation of the electroactive layer. Capacitance signals are transmitted through a plurality of second sensing electrodes at the other side the electroactive layer. The second sensing electrodes are spaced apart from the plurality of first sensing electrodes and the plurality of driving electrodes. The capacitance signals indicate a change in capacitance between the plurality of driving electrodes and the plurality of second sensing electrodes.

In one embodiment, the voltage signals are processed to determine touch positions and touch forces on the touch panel.

In one embodiment, the voltage signals are processed by a first read-out integrated circuit (IC) to detect a touch position and a touch force on the touch panel and the capacitance signals are processed by a second read-out IC to detect a change in the touch force.

In one embodiment, a driving signal is applied to the plurality of driving electrodes during a touch sensing period. Processing of the voltage signals by the first read-out IC and processing of the capacitance signals by the second read-out IC are performed during the touch sensing period.

In one embodiment, a driving signal is applied to the plurality of driving electrodes during a touch sensing period. Processing of the voltage signals by the first read-out IC is performed during a first touch sensing period of the touch sensing period, and processing of the capacitance signals are performed by the second read-out IC during a second touch sensing period different from the first touch sensing period.

The effects according to the present disclosure are not limited to the contents exemplified above, and various effects are included in the present specification.

BRIEF DESCRIPTION OF THE DRAWINGS

The above and other aspects, features, and other advantages of the present disclosure will be more clearly understood from the following detailed description taken in conjunction with the accompanying drawings.

DETAILED DESCRIPTION OF THE EMBODIMENT

Figure 1:
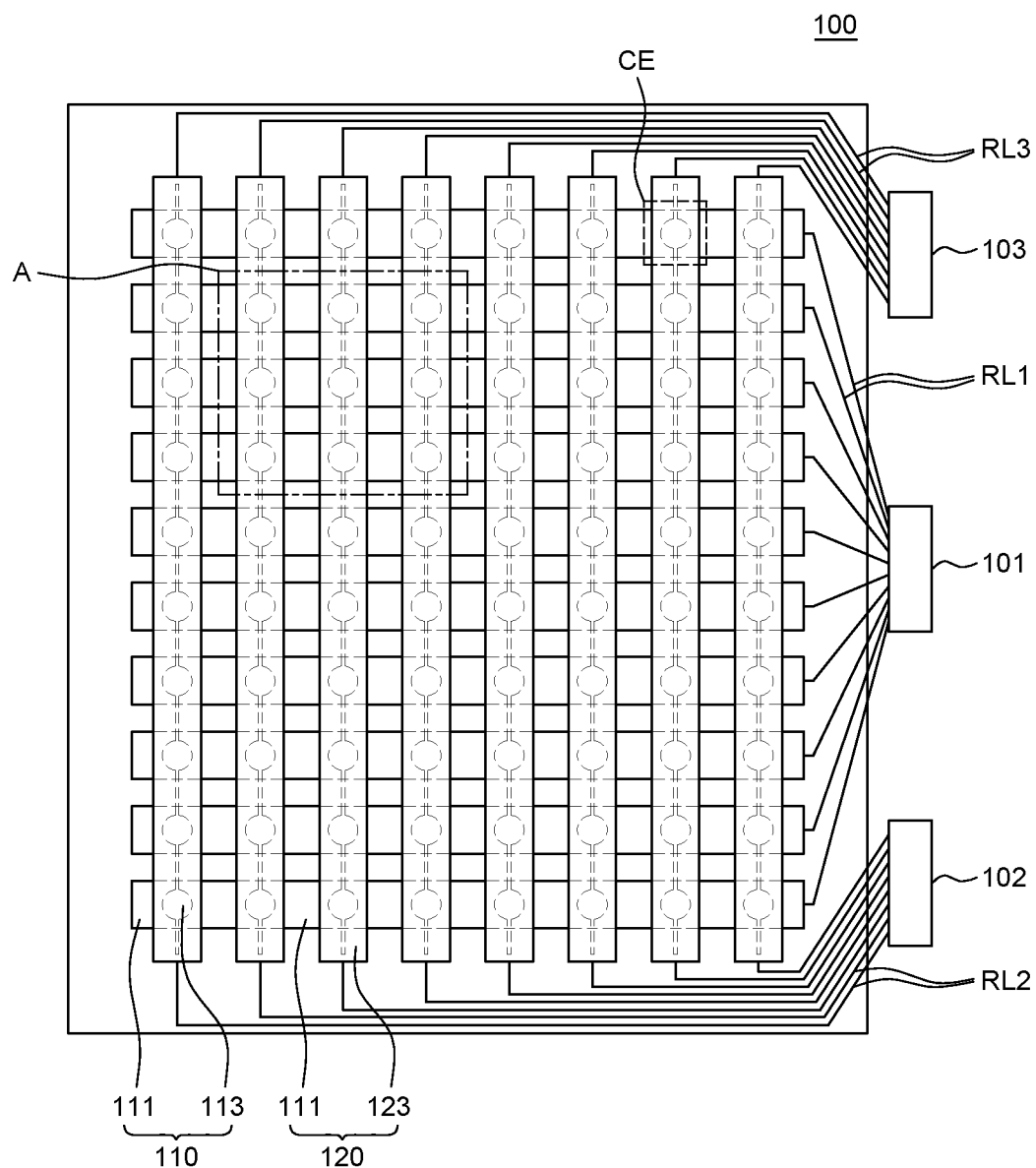
FIG. 1 is a schematic plan view of a touch panel according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein, but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or between.

Although the terms "first", "second", and the like are used for describing various components, these components are not confined by these terms. These terms are merely used for distinguishing one component from the other components.

Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the components illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a schematic plan view of a touch panel according to an exemplary embodiment of the present disclosure.

Referring to FIG. 1, a touch panel 100 according to an exemplary embodiment of the present disclosure includes a first touch sensor unit 110, a second touch sensor unit 120, a driving IC 101, a first read-out integrated circuit (IC) 102, and a second read-out integrated circuit (IC) 103.

The first touch sensor unit 110 includes a plurality of driving electrodes 111 and a plurality of first sensing electrodes 113. The first touch sensor unit 110 may sense a touch position and a touch force through the driving electrodes 111, the first sensing electrodes 113, and an electroactive layer 112 to be described below. In this case, the first touch sensor unit 110 may sense the touch position and the touch force by piezoelectric type sensing.

The second touch sensor unit 120 includes a plurality of driving electrodes 111 and a plurality of second sensing electrodes 123. The second touch sensor unit 120 may sense the change in a touch force through the driving electrodes 111 and the second sensing electrodes 123. In this case, the second touch sensor unit 120 may sense the change in the touch force by capacitive type sensing.

The driving IC 101 may supply a driving signal to the plurality of driving electrodes 111. The driving IC 101 is connected to the plurality of driving electrodes 111 by a plurality of first routing lines RL1 and transmits the driving signal to the plurality of driving electrodes 111 through the plurality of first routing lines RL1. Here, the driving signal may be a pulsed signal and the driving IC 101 may sequentially apply a pulsed signal having a high voltage to the plurality of driving electrodes 111.

The first read-out IC 102 is an IC which receives sensing signals (also referred to herein as "voltage signals") from the plurality of first sensing electrodes 113 to sense a touch position and a touch force of a user. The first read-out IC 102 is connected to the plurality of first sensing electrodes 113 by the plurality of second routing lines RL2. Therefore, the sensing signal from the plurality of first sensing electrodes 113 may be transmitted to the first read-out IC 102 by the plurality of second routing lines RL2 which is connected to the plurality of first sensing electrodes 113. The first read-out IC 102 may detect a position where the touch of the user is performed and a force of the touch of the user based on the transmitted sensing signal.

The second read-out IC 103 is an IC which receives a sensing signal (also referred to herein as "capacitance signals") from the plurality of second sensing electrodes 123 to sense a change in a touch force of the user. The second read-out IC 103 is connected to the plurality of second sensing electrodes 123 by the plurality of third routing lines RL3. Therefore, the sensing signal from the plurality of second sensing electrodes 123 may be transmitted to the second read-out IC 103 by the plurality of third routing lines RL3 which is connected to the plurality of second sensing electrodes 123. The second read-out IC 103 may detect a change in a touch force of the user based on the transmitted sensing signal in accordance with a time.

In the meantime, the number of driving electrodes 111, first sensing electrodes 113, and second sensing electrodes 123 illustrated in FIG. 1 is merely provided to describe the present disclosure, and is not limited thereto. That is, the number of driving electrodes 111, first sensing electrodes 113, and second sensing electrodes 123 may be larger or smaller than that illustrated in FIG. 1 as needed.

Hereinafter, a specific structure of the touch panel 100 will be described in more detail with reference to FIGS. 2 and 3.

Figure 2:
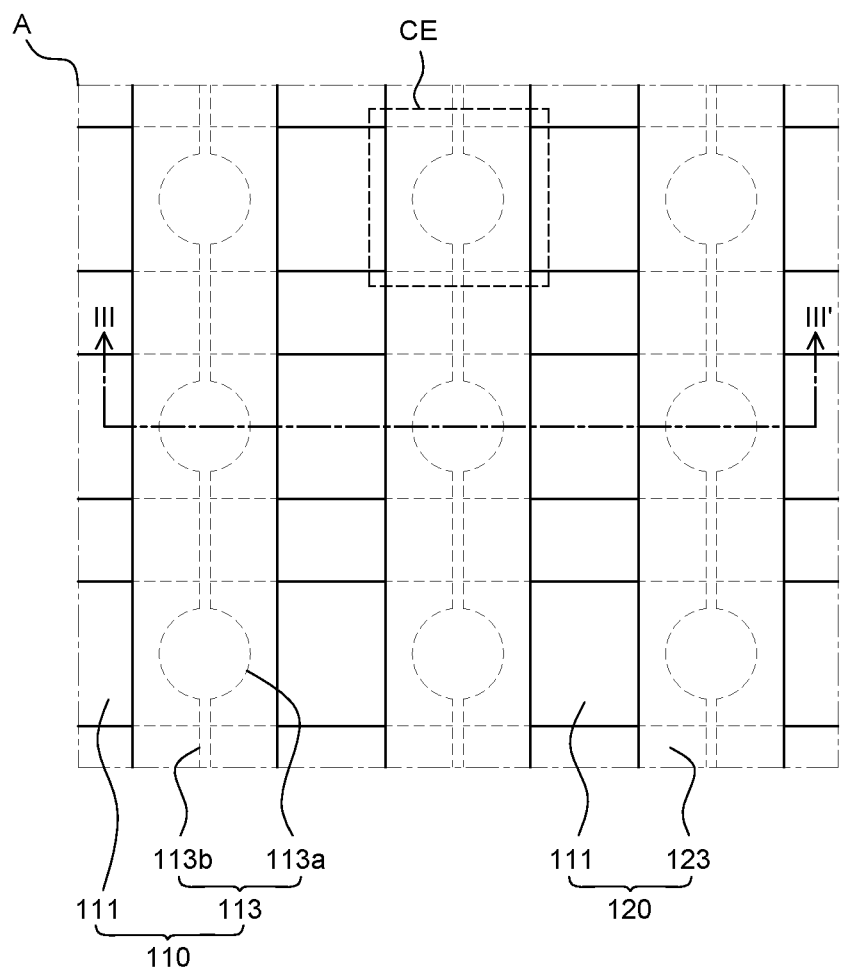
FIG. 2 is an enlarged view of an A area of FIG. 1.

FIG. 2 is an enlarged view of an A area of FIG. 1. FIG. 3 is a cross-sectional view taken along the line III-III' of FIG. 2.

Figure 3:
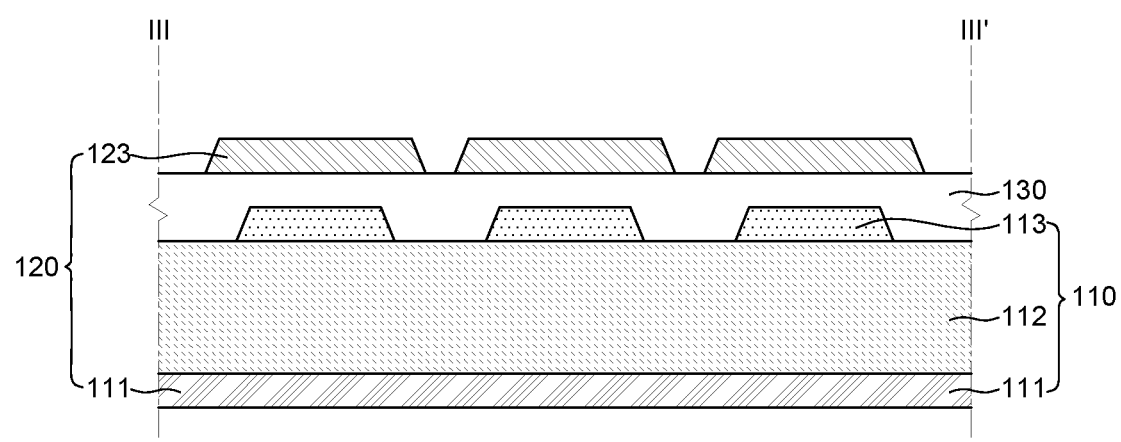
FIG. 3 is a cross-sectional view taken along the line III-III' of FIG. 2.

Referring to FIGS. 2 and 3, the touch panel 100 includes a first touch sensor unit 110 configured by a plurality of driving electrodes 111, an electroactive layer 112, and a plurality of first sensing electrodes 113 and a second touch sensor unit 120 configured by the plurality of driving electrodes 111 and a plurality of second sensing electrodes 123.

The plurality of driving electrodes 111 may serve as a common driving electrode of the first touch sensor unit 110 and the second touch sensor unit 120. The driving signal may be sequentially applied to the plurality of driving electrodes 111 by the driving IC 101. The plurality of driving electrodes 111 is spaced apart from each other to extend in a first direction. Here, the first direction refers to a horizontal direction in FIGS. 1 and 2, but is not limited thereto.

The plurality of driving electrodes 111 may be formed of a transparent conductive material. For example, the driving electrodes 111 may be formed of transparent conductive oxide (TCO) such as indium tin oxide (ITO), indium zinc oxide (IZO). Further, the driving electrode 111 may also be formed of silver nano wire (Ag nano wire), carbon nano tube (CNT), or graphene having excellent transmittance and excellent electrical conductivity. Further, the driving electrode 111 may be configured by a metal mesh. That is, the driving electrode 111 is configured to be a mesh type of a metal line having a small thickness to substantially serve as a transparent electrode. However, constituent materials of the driving electrodes 111 are not limited to the above-described examples, but various conductive materials may be used for the constituent materials of the driving electrodes 111.

The electroactive layer 112 is disposed on the plurality of driving electrodes 111. The electroactive layer 112 may be a plate type film which is formed of an electroactive material (EAM) which generates a voltage by polarization of a material when a pressure is applied. The electroactive layer 112 may be formed of a material having a low Young's modulus so as to be easily deformed by a touch pressure of a user and quickly restored to its original shape. For example, the electroactive layer 112 may be formed of dielectric elastomer such as silicon, urethane, or acrylic elastomer, ferroelectric polymer such as PVDF or P(VDF-TrFE), or a piezo ceramic element.

When a touch input of the user is applied, electric charge polarization may be generated in a material which forms the electroactive layer 112 in a position where the touch of the user is applied, by the piezoelectric effect. In this case, when a driving signal is applied to the driving electrode 111 corresponding to an area where the touch of the user is applied, the first sensing electrode 113 corresponding to the area may transmit a voltage by the electric charge polarization of the electroactive layer 112 to the first read-out IC 102. The first read-out IC 102 may detect the touch position and the touch force of the user based on the transmitted voltage, which will be described in detail below.

A plurality of first sensing electrodes 113 is disposed on the electroactive layer 112. The plurality of first sensing electrodes 113 is sensing electrodes of the first touch sensor unit 110 for sensing the touch position and the touch force of the user.

The plurality of first sensing electrodes 113 is spaced apart from each other to extend in a second direction which is different from the first direction. Therefore, the plurality of first sensing electrodes 113 may be disposed to intersect the plurality of driving electrodes 111 on the plurality of driving electrodes 111. That is, one of the first sensing electrodes 113 which extends in the second direction overlaps the plurality of driving electrodes 111 which extends in the first direction, at an intersection. In this case, each of the points where the plurality of first sensing electrodes 113 and the plurality of driving electrodes 111 intersect to overlap each other may be defined as a cell CE which is a minimum unit of sensing the touch position and the touch force of the user in the touch panel 100. Here, the second direction refers to a vertical direction in FIGS. 1 and 2, but is not limited thereto.

The plurality of first sensing electrodes 113 may be formed of a transparent conductive material. For example, the first sensing electrodes 113 may be formed of transparent conductive oxide (TCO) such as indium tin oxide (ITO), indium zinc oxide (IZO). Further, the first sensing electrodes 113 may be formed of silver nano wire (Ag nano wire), carbon nano tube (CNT), or graphene having excellent transmittance and excellent electrical conductivity. Further, the first sensing electrodes 113 may be configured by a metal mesh. However, constituent materials of the first sensing electrodes 113 are not limited to the above-described examples, but various conductive materials may be used for the constituent materials of the first sensing electrodes 113. The first sensing electrodes 113 may be formed of the same material as the driving electrode 111 or may be formed of a different material from the driving electrode 111.

In the meantime, each of the plurality of first sensing electrodes 113 includes a plurality of sub electrodes 113a disposed in an area overlapping the plurality of driving electrodes 111 and a plurality of bridge electrodes 113b which extends in the second direction to connect the plurality of sub electrodes 113a.

The plurality of sub electrodes 113a is provided in one first sensing electrode 113 to be spaced apart from each other. Further, the plurality of sub electrodes 113a may be disposed in a center of the cell CE which is an overlapping area of the plurality of driving electrodes 111 and the plurality of first sensing electrodes 113. It is illustrated that the plurality of sub electrodes 113a has a circular shape, but it is not limited thereto and the plurality of sub electrodes 113a may have a polygonal shape.

The plurality of sub electrodes 113a may be portions which substantially sense the touch position and the touch force of the user in the first touch sensor unit 110. That is, the plurality of sub electrodes 113a may sense the touch input of the user through an electrical interaction with the driving electrode 111 and the electroactive layer 112 disposed in the same cell CE.

The plurality of bridge electrodes 113b extends in the second direction to connect the plurality of sub electrodes 113a to each other. A width of the plurality of bridge electrodes 113b in the first direction may be smaller than a width of the plurality of sub electrodes 113a in the first direction, but is not limited thereto.

A sensitivity to the touch may be increased as the overlapping area of the first sensitive electrodes 113 and the plurality of driving electrodes 111 is decreased. Specifically, as the area of the plurality of first sensing electrodes 113 is increased, parasitic capacitance is generated so that an amount of current loss between the driving electrode 111 and the first sensing electrode 113 is increased. Therefore, the loss current of the first sensing electrode 113 is minimized and a sufficient output voltage may be ensured by making the width of the bridge electrode 113b be smaller than the width of the sub electrode 113a.

The first touch sensor unit 110 may sense the touch position and the touch force of the user by piezoelectric type sensing using the electroactive layer 112 and the plurality of driving electrodes 111 and the plurality of sensing electrodes 113 which are disposed on one surface and the other surface of the electroactive layer 112, respectively. That is, the first touch sensor unit 110 may sense the touch position and the touch force based on an electrical change between the driving electrode 111 and the first sensing electrode 113 in each of the plurality of cells CE.

Specifically, when the user touches a specific cell CE of the driving electrode 111 to which a driving signal is applied, electric charge polarization may be generated in the electroactive layer 112 disposed in the specific cell CE by the touch pressure. A peak may be generated at the voltage sensed by the first sensing electrode 113 disposed in the specific cell CE by the electric charge polarization of the electroactive layer 112. In this case, the voltage generated by the electric charge polarization may vary according to the touch pressure. That is, as the touch force is increased, a peak of the voltage sensed by the first sensing electrode 113 may also be increased. The sensing signal generated at the peak voltage may be transmitted from the first sensing electrode 113 to the first read-out IC 102.

When a sensed voltage is equal to or higher than a threshold value, the first read-out IC 102 may recognize that the corresponding position is touched.

Further, the first read-out IC 102 may detect a magnitude of the touch force by detecting a a voltage level which is transmitted from the first sensing electrode 113. For example, the first read-out IC 102 may detect not only the touch input, but also the touch force based on data on a magnitude of touch force and a size of a voltage sensed from the first sensing electrode 113, stored in a memory.

The insulating layer 130 is disposed on the electroactive layer 112 and the plurality of first sensing electrodes 113. Referring to FIG. 3, the insulating layer 130 is disposed to cover the electroactive layer 112 and the first sensing electrodes 113. Therefore, the insulating layer 130 may electrically insulate the first sensing electrode 113 and the second sensing electrode 123 from each other. The insulating layer 130 may be formed of a transparent insulating material, for example, may be formed of a material such as silicon oxide (SiOx) or silicon nitride (SiNx).

A plurality of second sensing electrodes 123 is disposed on the insulating layer 130. Further, the plurality of second sensing electrodes 123 may overlap the plurality of first sensing electrodes 113. In this case, the plurality of second sensing electrodes 123 may be insulated from the plurality of first sensing electrodes 113 by the insulating layer 130. The plurality of second sensing electrodes 123 of the second touch sensor unit 120 senses the change in the touch force of the user.

The plurality of second sensing electrodes 123 is spaced apart from each other to extend in the second direction. Therefore, the plurality of second sensing electrodes 123 may be disposed to intersect the plurality of driving electrodes 111 on the plurality of driving electrodes 111. That is, one second sensing electrode 123 which extends in the second direction overlaps the plurality of driving electrodes 111 which extends in the first direction, at intersections. In this case, each of the points where the plurality of second sensing electrodes 123 and the plurality of driving electrodes 111 intersect to overlap each other may be defined as a cell CE which is a minimum unit of sensing the change in the touch force of the user in the touch panel 100. The cell CE in which the plurality of second sensing electrodes 123 and the plurality of driving electrodes 111 overlap each other may be the same cell CE in which the plurality of first sensing electrodes 113 and the plurality of driving electrodes 111 overlap each other.

The plurality of second sensing electrodes 123 may sense the change in the touch force by electrical interaction with the driving electrode 111 disposed in the same cell CE. That is, each of the plurality of second sensing electrodes 123 may sense a change in capacitance in the corresponding cell CE.

In this case, each of the plurality of second sensing electrodes 123 may have a larger area than that of the plurality of first sensing electrodes 113 to ensure sufficient area for the change in the capacitance. Specifically, when the touch force of the user is changed, the pressed area may vary due to the change in the pressure. For example, when the touch force of the user is increased, the pressed area is increased so that the plurality of second sensing electrodes 123 needs to sense the change in the capacitance in the corresponding area. Therefore, an area of each of the plurality of second sensing electrodes 123 may be larger than an area of each of the plurality of first sensing electrodes 113.

The plurality of second sensing electrodes 123 may be formed of a transparent conductive material. For example, the second sensing electrodes 123 may be formed of transparent conductive oxide (TCO) such as indium tin oxide (ITO), indium zinc oxide (IZO). Further, the second sensing electrodes 123 may be formed of silver nano wire (Ag nano wire), carbon nano tube (CNT), or graphene having excellent transmittance and excellent electrical conductivity. Further, the second sensing electrodes 123 may be configured by a metal mesh. However, constituent materials of the second sensing electrodes 123 are not limited to the above-described examples, but various conductive materials may be used for the constituent materials of the second sensing electrodes 123. The second sensing electrodes 123 may be formed of the same material as the driving electrode 111 and the first sensing electrode 113 or may be formed of a different material from the driving electrode 111 and the first sensing electrode 113.

The second touch sensor unit 120 may sense the change in the touch force of the user by capacitive type sensing using the plurality of driving electrodes 111 and the plurality of second sensing electrodes 123 which are spaced apart from each other. That is, the second touch sensor unit 120 may sense the change in the touch force based on an electrical change between the driving electrode 111 and the second sensing electrode 123 in each of the plurality of cells CE.

Specifically, when a touch input is applied to a specific cell CE and a force of the applied touch input is changed, the capacitance between the driving electrode 111 and the second sensing electrode 123 corresponding to the specific cell CE may be changed. That is, when the touch force of the user is changed, an interval between the driving electrode 111 and the second sensing electrode 123 and an area of the second sensing electrode 123 overlapping a finger of the user are changed due to the pressure change by the touch and the capacitance is also changed. The sensing signal for the capacitance change may be transmitted from the second sensing electrode 123 to the second read-out IC 103.

The second read-out IC 103 may detect the changed amount of touch force through the capacitance change. For example, when the touch input is initially applied, the second read-out IC 103 may store the sensed initial capacitance value as a reference capacitance value. When the capacitance value which is changed due to the change of the force of the touch input is sensed, the changed amount of capacitance may be detected by a difference between the initial capacitance value and the changed capacitance value. Therefore, when a capacitance value which is higher than the initial capacitance value is detected, the second read-out IC 103 determines that the touch force of the user is increased. When a capacitance value which is lower than the initial capacitance value is detected, the second read-out IC 103 determines that the touch force of the user is decreased.

Normally, a touch position sensor which senses a touch position and a touch force sensor which senses a touch force are separately provided. That is, in order to sense both the touch position and the touch force, a total of two sensors are necessary resulting in disadvantages such that a thickness of the entire device is increased, a manufacturing process is complex, and a manufacturing cost is increased.

Therefore, the touch panel 100 according to an exemplary embodiment of the present disclosure may configure a first touch sensor unit 110 which piezoelectrically senses the touch position and the touch force by disposing the electroactive layer 112 between the plurality of driving electrodes 111 and the plurality of first sensing electrodes 113. That is, the first touch sensor unit 110 may detect not only the touch position of the user, but also the touch force according to the touch pressure, based on the piezoelectric effect of the electroactive layer 112.

Further, in the touch panel 100 according to the exemplary embodiment of the present disclosure, both the touch position and the touch force may be detected by a single first touch sensor unit 110. Accordingly, as compared with a case in which the touch position sensor and the touch force sensor are separately provided, the touch sensor may become thinner and lighter and the manufacturing process may be simplified. Further, the touch position and the touch force are simultaneously sensed only by the first touch sensor unit 110, so that the driving of the sensor may be simplified.

However, the piezoelectric type touch sensor may not detect the change in the touch force in accordance with the time. Specifically, when the user touches the piezoelectric type touch sensor, a voltage is generated according to an applied pressure at the moment when the touch is generated. However, even though the touch is continuously generated, the voltage is not generated when a predetermined time elapses. Therefore, when the touch force of the user is increased or decreased, the piezoelectric type touch sensor may not sense the change in the touch force of the user.

Therefore, the touch panel 100 according to the exemplary embodiment of the present disclosure may further include a second touch sensor unit 120 which capacitively senses the change in the touch force by means of the plurality of driving electrodes 111 and the plurality of second sensing electrodes 123. Therefore, the touch panel 100 according to the exemplary embodiment of the present disclosure may sense not only the touch position and the touch force, but also the change in the touch force to sense various touch inputs.

Further, in the touch panel 100 according to the exemplary embodiment of the present disclosure, the first touch sensor unit 110 and the second touch sensor unit 120 may be integrally formed in one panel. That is, in the touch panel 100 according to the exemplary embodiment of the present disclosure, the first touch sensor unit 110 and the second touch sensor unit 120 may share the plurality of driving electrodes 111 as commonly used driving electrodes. Therefore, in the touch panel 100 according to the exemplary embodiment of the present disclosure, one touch panel 100 is used to sense all of the touch position, the touch force, and the change in the touch force. Further, the first touch sensor unit 110 and the second touch sensor unit 120 may be integrally formed so that it is possible to implement a thinner touch panel 100 and simplify the manufacturing process.

Further, the touch panel 100 according to the exemplary embodiment of the present disclosure may have transparency and flexibility. As described above, all components of the first touch sensor unit 110 and the second touch sensor unit 120 which configure the touch panel 100 according to the exemplary embodiment of the present disclosure may be formed of transparent and flexible materials. Therefore, the touch panel 100 may be disposed both on and below the display panel of the display device so that a degree of design freedom of the display device may be improved. Further, the touch panel 100 according to the exemplary embodiment of the present disclosure may be applicable to various display devices, for example, a transparent display device and a flexible display device.

Hereinafter, a driving method of a touch panel according to an exemplary embodiment of the present disclosure will be described with reference to FIG. 4.

Figure 4:
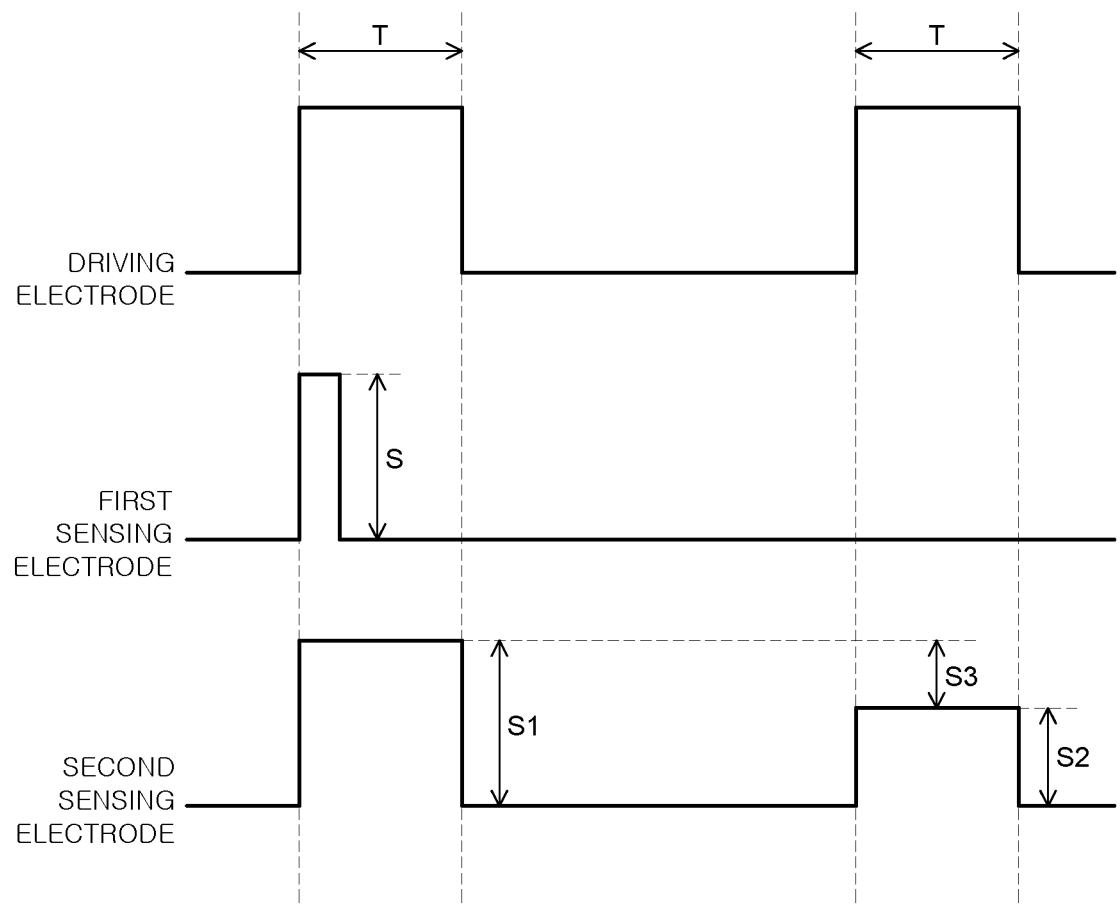
FIG. 4 illustrates a schematic operation timing for explaining a driving method of a touch panel according to an exemplary embodiment of the present disclosure.

FIG. 4 illustrates a schematic operation timing for explaining a driving method of a touch panel according to an exemplary embodiment of the present disclosure. FIG. 4 schematically illustrates an example of a driving signal which is applied to the driving electrode 111 corresponding to a specific cell CE and a sensing signal detected by the first sensing electrode 113 and the second sensing electrode 123, when a touch input is applied to the specific cell CE and a force of the applied touch is reduced while maintaining the touch. Hereinafter, for the convenience of description, the driving method of a touch panel will be described also with reference to FIGS. 1 to 3.

In a touch panel 100 according to an exemplary embodiment of the present disclosure, a first read-out IC 102 and a second read-out IC 103 are simultaneously driven during a touch sensing period T.

Referring to FIG. 4, the driving IC 101 applies a pulsed driving signal to the driving electrode 111. In this case, a period when the driving signal has a high voltage may be defined as a touch sensing period T. In FIG. 4, for the convenience of description, only two touch sensing periods T are illustrated. Hereinafter, it is assumed that the touch of the user is input at a start timing of a first touch sensing period T between two touch sensing periods T, and during a second touch sensing period T, the touch input of the user is maintained but the touch force is reduced. First, a sensing signal generated in the first sensing electrode 113 will be described. During the first touch sensing period T, the first sensing electrode 113 may sense a sensing signal corresponding to a voltage having a first size S. That is, when the driving signal is applied to the driving electrode 111 by the driving IC 101, if the touch is input by the user, a peak voltage may be generated in the electroactive layer 112. The first sensing electrode 113 may transmit a sensing signal corresponding to the voltage having a first size S to the first read-out IC 102.

The first read-out IC 102 may detect whether the touch is generated and a touch force based on a voltage value of the transmitted sensing signal. For example, when a first size S of the sensing signal is larger than a predetermined threshold value, the first read-out IC 102 may determine that the touch is generated in the corresponding position. Further, the first read-out IC 102 may detect a magnitude of the touch force based on the first size S. For example, the first read-out IC 102 may also detect the touch force at a touch timing, based on data on a magnitude of touch force stored in a memory and the first size S which is a size of a voltage which is detected from the first sensing electrode 113.

During the second touch sensing period T, the first sensing electrode 113 does not sense the sensing signal. As described above, the touch of the user is maintained, but the change in voltage is not sensed in the first sensing electrode 113.

Next, a sensing signal generated in the second sensing electrode 123 will be described. During the first touch sensing period T, the second sensing electrode 123 may sense a sensing signal having a first level S1. That is, the second sensing electrode 123 may sense a first level S1 of sensing signal for a capacitance value between the driving electrode 111 and the second sensing electrode 123. The second sensing electrode 123 may transmit a sensing signal corresponding to the first level S1 to the second read-out IC 103.

During the second touch sensing period T, the second sensing electrode 123 may sense a sensing signal having a second level S2. As described above, even though the touch of the user is maintained, the touch force is reduced. Therefore, an interval between the second sensing electrode 123 and the driving electrode 111 is changed in accordance with the change in the touch force, or an area of a finger of the user which overlaps the second sensing electrode 123 is changed, the capacitance also changing. The second sensing electrode 123 may transmit a sensing signal having a second level S2 for the changed capacitance to the second read-out IC 103.

The second read-out IC 103 may compare the reference value stored during the first touch sensing period T and the capacitance sensed during the second touch sensing period T to detect a changed amount of the capacitance. In this case, the changed amount of the capacitance may have a third level S3 which is a difference between the first level S1 of sensing signal and the second level S2 of sensing signal. When the third level S3 which is a changed amount is equal to or higher than a predetermined range, the second read-out IC 103 may determine that the touch force is changed in the corresponding cell CE.

Further, the second read-out IC 103 may determine whether the touch force is increased or decreased depending on a polarity of the third level S3. That is, when a capacitance value which is higher than the initial capacitance value is detected so that the third level S3 has a positive value, the second read-out IC 103 determines that the touch force of the user is increased. When a capacitance value which is lower than the initial capacitance value is detected so that the third level S3 has a negative value, the second read-out IC 103 determines that the touch force of the user is decreased.

In the meantime, even though not illustrated, when the user changes a touch position from a specific cell CE to a different cell CE while applying the touch input, the capacitance of the corresponding cell CE may also be changed in accordance with the movement of the touch. Therefore, the second read-out IC 103 detects a coordinate of a cell CE where the change in the capacitance is detected to detect the change in the touch position.

Figure 5:
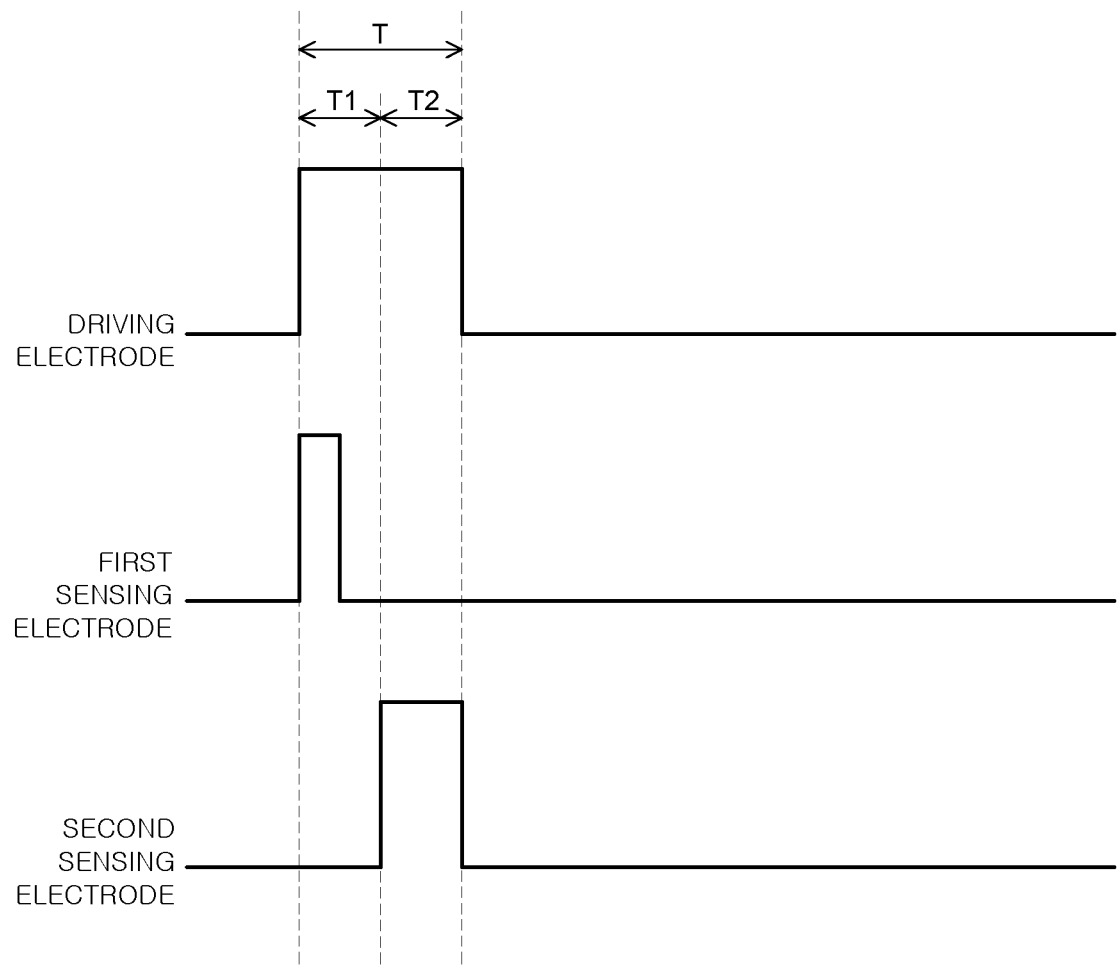
FIG. 5 illustrates a schematic operation timing for explaining a driving method of a touch panel according to another exemplary embodiment of the present disclosure.

FIG. 5 illustrates a schematic operation timing for explaining a driving method of a touch panel according to another exemplary embodiment of the present disclosure. FIG. 5 schematically illustrates an example of a driving signal which is applied to the driving electrode 111 corresponding to a specific cell CE and a sensing signal detected by the first sensing electrode 113 and the second sensing electrode 123 when a touch input is applied to the specific cell CE. Hereinafter, for the convenience of description, the driving method of a touch panel will be described also with reference to FIGS. 1 to 3.

In a touch panel 100 according to another exemplary embodiment of the present disclosure, a first read-out IC 102 and a second read-out IC 103 may be driven in a time-division manner during a touch sensing period T.

Referring to FIG. 5, the touch sensing period T may be divided into a first touch sensing period T1 and a second touch sensing period T2. In this case, during the first touch sensing period T1, only the first read-out IC 102 which detects the touch position and the touch force is driven and during the second touch sensing period T2, only the second read-out IC 103 which detects a change in the touch force is driven.

That is, in the exemplary embodiment of FIG. 4, the first read-out IC 102 and the second read-out IC 103 are simultaneously driven during the touch sensing period T, but in the present exemplary embodiment, the first read-out IC 102 and the second read-out IC 103 are separately driven in a time-division manner. Except that the first read-out IC 102 and the second read-out IC 103 are separately driven in a time-division manner during the touch sensing period T, a basic driving principle is the same as that described in FIG. 4. Therefore, a time-divisional driving of the first read-out IC 102 and the second read-out IC 103 during the touch sensing period T will be described with reference to FIG. 5.

Referring to FIG. 5, the driving IC 101 applies a pulsed driving signal to the driving electrode 111. During the touch sensing period T when the driving signal has a high level, a touch input of the user may be applied.

First, a sensing signal generated in the first sensing electrode 113 will be described. During the first touch sensing period T1, the first sensing electrode 113 may sense a high level sensing signal in accordance with the change in the voltage. The high level sensing signal may be transmitted to the first read-out IC 102. The first read-out IC 102 may detect the touch position and the touch force through the sensing signal.

During the second touch sensing period T2, the first sensing electrode 113 does not sense the sensing signal. That is, during the second touch sensing period T2, the first read-out IC 102 is not driven, so that the sensing signal is not generated in the first sensing electrode 113.

Next, a sensing signal generated in the second sensing electrode 123 will be described. During the first touch sensing period T1, the second sensing electrode 123 does not sense a sensing signal. That is, during the first touch sensing period T1, the second read-out IC 103 is not driven, so that even though the touch input of the user is applied, the second read-out IC 103 does not sense the sensing signal for the capacitance.

During the second touch sensing period T2, the second sensing electrode 123 may sense a high level sensing signal for the capacitance. The high level sensing signal may be transmitted to the second read-out IC 103.

Further, even though not illustrated, the second read-out IC 103 compares a sensing signal generated during the second touch sensing period T2 of a subsequent touch sensing period T and a sensing signal generated during the second touch sensing period T2 of the present touch sensing period T to detect a change in a touch force.

In the touch panel 100 according to another exemplary embodiment of the present disclosure, one touch sensing period T1 is divided into the first touch sensing period T1 and the second touch sensing period T2 so that the first read-out IC 102 and the second read-out IC 103 are driven in a time-division manner. Therefore, a precision of a sensing signal which is sensed by the first sensing electrode 113 and the second sensing electrode 123 may be improved. That is, as the first sensing electrode 113 and the second sensing electrode 123 overlap each other, interference may be generated during the process of sensing the sensing signal by the first sensing electrode 113 and the second sensing electrode 123. Therefore, in the touch panel 100 according to another exemplary embodiment of the present disclosure, one touch sensing period T is time-divided into the first touch sensing period T1 and the second touch sensing period T2 so that the first read-out IC 102 and the second read-out IC 103 are driven in a time-division manner. Therefore, the interference between the first touch sensor unit 110 and the second touch sensor unit 120 is minimized and the precision of the first touch sensor unit 110 and the second touch sensor unit 120 may be improved.

Figure 6:
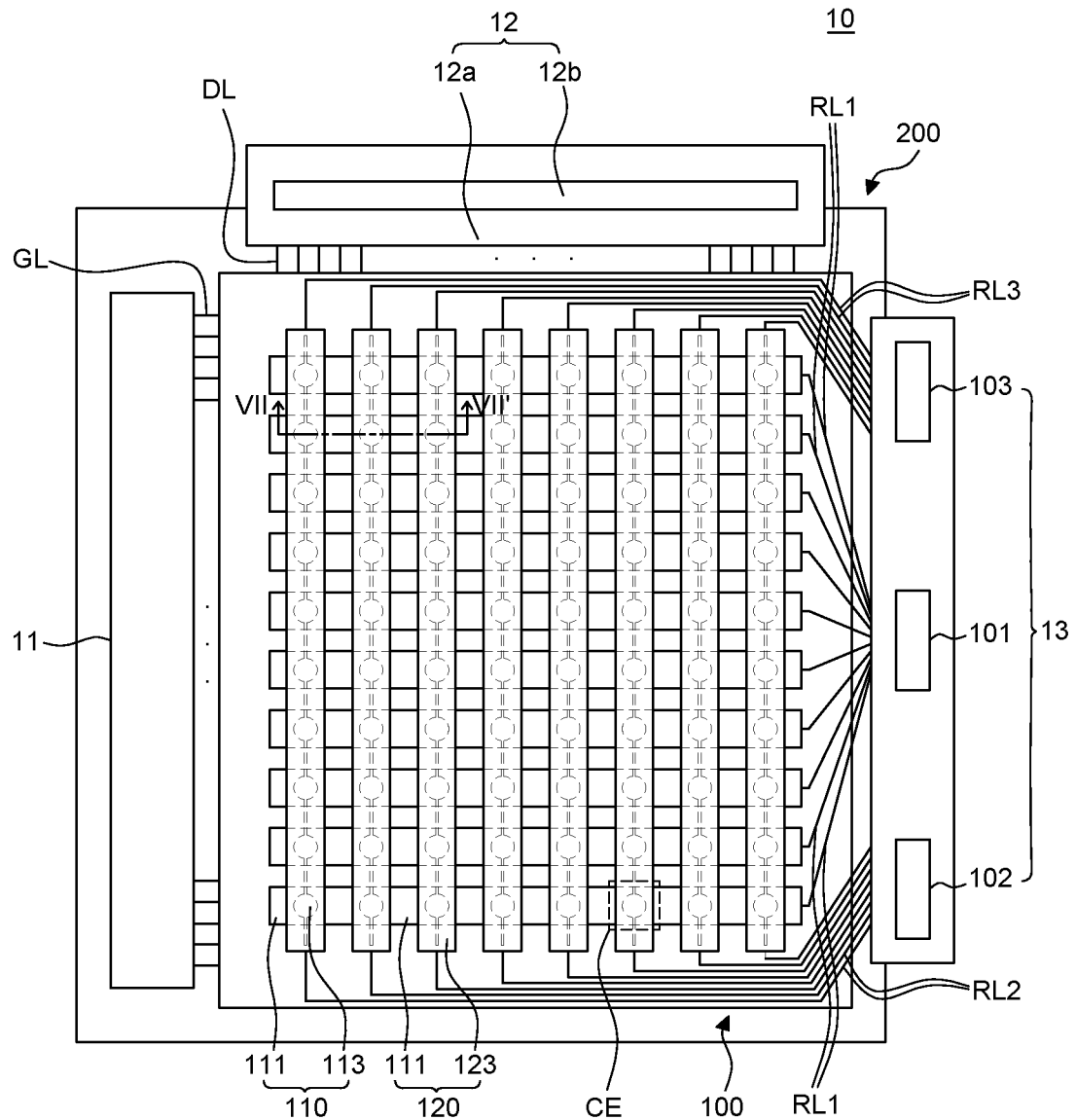
FIG. 6 is a schematic plan view of a display device according to an exemplary embodiment of the present disclosure.
Figure 7:
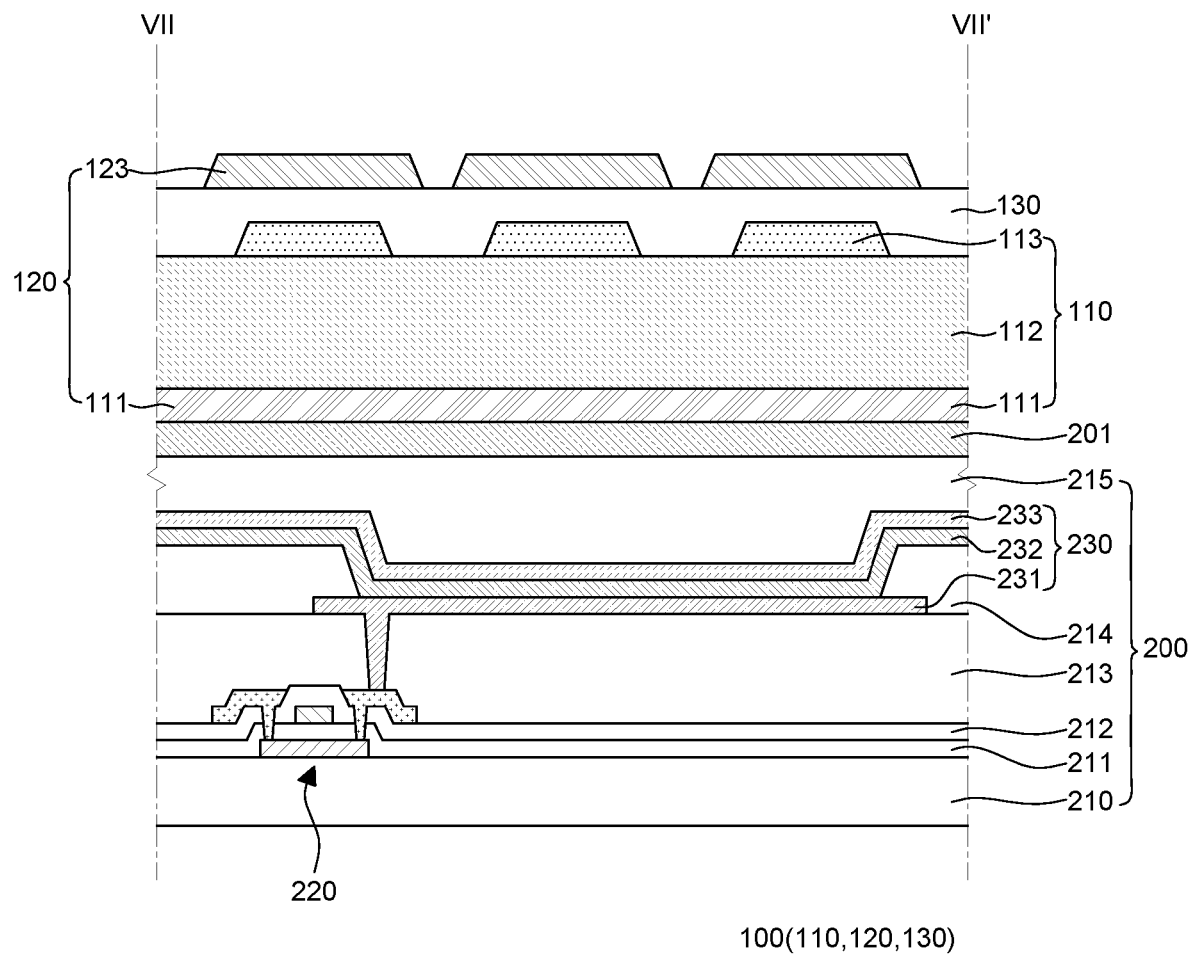
FIG. 7 is a cross-sectional view taken along the line VII-VII' of FIG. 6.

FIG. 6 is a schematic plan view of a display device according to an exemplary embodiment of the present disclosure. FIG. 7 is a cross-sectional view taken along the line VII-VII' of FIG. 6.

Referring to FIG. 6, a display device 10 according to an exemplary embodiment of the present disclosure includes a display panel 200, a touch panel 100 disposed above the display panel 200, a gate driver 11, a data driver 12, and a touch driver 13. A redundant description of the same configuration as the above-described configuration will be omitted.

The display device 10 may be included in various electronic apparatuses, such as a TV, a monitor, a notebook PC, a smart phone, and a wearable electronic device.

The display panel 200 refers to a panel on which a display device for displaying images is disposed in the display device 10. As the display panel 200, for example, various display panels such as an organic light emitting display panel, a liquid crystal display panel, and an electrophoretic display panel may be used. Further, the display panel 200 may have flexibility and may be implemented as a transparent display panel. In the meantime, even though not illustrated in the drawing, the display panel 200 may include a display area which overlaps the touch panel 100 and a non-display area surrounding the display area. In FIGS. 6 and 7, it is described that the display panel 200 is an organic light emitting display panel, but it is not limited thereto.

The display area is an area in which an image is actually displayed in the display device 10. A display unit, various driving elements for driving the display unit, and signal lines are disposed in the display area.

A plurality of pixels may be disposed in the display area. In this case, the plurality of pixels may be defined as intersecting areas of a plurality of gate lines GL disposed in a first direction and a plurality of data lines DL disposed in a second direction which is different from the first direction. The plurality of pixels is a minimum unit which emits light and includes a red pixel, a green pixel, and a blue pixel. Each of the plurality of pixels may be connected to the gate driver 11 and the data driver 12 through the gate lines GL and the data lines DL.

The non-display area is an area where no image is displayed and is defined as an area enclosing the display area. In the non-display area, various components for driving a plurality of pixels disposed in the display area may be disposed. For example, as illustrated in FIG. 6, the gate driver 11, the data driver 12, and the touch driver 13 may be disposed in the non-display area.

The gate driver 11 outputs a gate signal under the control of a timing controller and selects a pixel in which a data voltage is charged through the plurality of gate lines GL. The gate driver 11 may sequentially supply a gate signal to the gate lines using a shift register. In FIG. 6, the gate driver 11 is implemented as a gate in panel (GIP) which is mounted in the display panel, but is not limited thereto.

The data driver 12 is a configuration which processes data for displaying images and a driving signal for processing the data and supplies signals to the plurality of pixels of the display area. The data driver 12 supplies the data voltage to the plurality of pixels of the display area through the plurality of data lines DL.

The data driver 12 may include a base film 12a and a driving IC 12b. The base film 12a is a film which supports the data driver 12. The base film 12a may be formed of an insulating material, for example, and may be formed of an insulating material having flexibility. The driving IC 12b is a configuration which processes a data voltage for displaying images and a driving signal for processing the data. The driving IC 12b may be disposed by a chip on glass (COG), a chip on film (COF), or tape carrier package (TCP) manner depending on a mounting method in the display device 10. In FIG. 6, it is illustrated that the data driver 12 is mounted on the base film 12a in the COF manner, but it is not limited thereto.

The touch driver 13 transmits a driving signal for sensing a touch input of the touch panel 100 and receives a sensed sensing signal to detect a touch position, a touch force, and a changed amount of touch force. The touch driver 13 includes a driving IC 101, a first read-out IC 102, and a second read-out IC 103. Similarly to the above-described data driver 12, it is illustrated that the touch driver 13 is mounted in the COF manner, but it is not limited thereto.

The driving IC 101 is connected to the plurality of driving electrodes 111 of the touch panel 100 by the plurality of first routing lines RL1 to transmit the driving signal. The first read-out IC 102 is connected to the plurality of first sensing electrodes 113 of the touch panel 100 by the plurality of second routing lines RL2 to receive the sensing signal. The second read-out IC 103 is connected to the plurality of second sensing electrodes 123 of the touch panel 100 by the plurality of third routing lines RL3 to receive the sensing signal.

The plurality of first routing lines RL1 may be formed of the same material as the driving electrode 111 in the touch panel 100. However, it is not limited thereto, and the plurality of first routing lines RL1 may be formed of a conductive material which is different from the driving electrode 111 in the touch panel 110. The plurality of first routing lines RL1 extends to the display panel 200 at an end of the touch panel 100 through a contact hole to be disposed on the display panel 200 in an area of the display panel 200 where the touch panel 100 and the display panel 200 do not overlap.

The plurality of second routing lines RL2 may be formed of the same material as the first sensing electrode 113 in the touch panel 100. However, it is not limited thereto, and the plurality of second routing lines RL2 may be formed of a conductive material which is different from the first sensing electrode 113 in the touch panel 110. The plurality of second routing lines RL2 extends to the display panel 200 at an end of the touch panel 100 through a contact hole to be disposed on the display panel 200 in an area of the display panel 200 where the touch panel 100 and the display panel 200 do not overlap.

A plurality of third routing lines RL3 may be formed of the same material as the second sensing electrode 123 in the touch panel 100. However, it is not limited thereto, and the plurality of third routing lines RL3 may be formed of a conductive material which is different from the second sensing electrode 123 in the touch panel 110. The plurality of third routing lines RL3 extends to the display panel 200 at an end of the touch panel 100 through a contact hole to be disposed on the display panel 200 in an area of the display panel 200 where the touch panel 100 and the display panel 200 do not overlap. Referring to FIG. 6, the touch driver 13 is disposed at an opposite side of the gate driver 11 to be spaced apart from the gate driver 11 and the data driver 12. That is, the touch driver 13 may be disposed at a side where the gate driver 11 and the data driver 12 are not disposed in the display panel. Therefore, in FIG. 6, even though it is illustrated that the touch driver 13 is disposed at an opposite side of the gate driver 11, the touch driver 13 may be disposed at an opposite side of the data driver 12 or disposed at both the opposite side of the gate driver 11 and an opposite side of the data driver 12.

Referring to FIGS. 6 and 7, the touch panel 100 may be disposed on the display area of the display panel 200. Specifically, the plurality of cells CE of the touch panel 100 may overlap the plurality of pixels of the display area. In this case, the touch panel 100 may be formed of transparent materials to minimize the visibility degradation of the image displayed from the display panel 200. In the meantime, even though in FIGS. 6 and 7, it is illustrated that the touch panel 100 is disposed above the display panel 200, the touch panel 100 may be disposed below the display panel 200.

Referring to FIG. 7, the display panel 200 includes a first substrate 210, a thin film transistor 220, a first insulating layer 211, a second insulating layer 212, an overcoating layer 213, a bank 214, an organic light emitting diode 230, and an encapsulation unit 215. That is, the display panel 200 is a top emission type organic light emitting display panel in which light emitted from the organic light emitting diode 230 is discharged through an opposite surface of a surface of the first substrate 210 on which the thin film transistor 220 is disposed, but, it is not limited thereto.

The first substrate 210 is a substrate which supports various components of the display panel 200. The first substrate 210 may be formed of glass or a plastic having flexibility.

The thin film transistor 220 is disposed on the first substrate 210. Specifically, an active layer is disposed on the first substrate 210 and a first insulating layer 211 which insulates the active layer from a gate electrode is disposed on the active layer. The gate electrode is disposed on the first insulating layer 211 and a second insulating layer 212 which covers the gate electrode is disposed thereon. A source electrode and a drain electrode are disposed on the second insulating layer 212 and are electrically connected to the active layer. In FIG. 7, even though only a driving thin film transistor is illustrated among various thin film transistors which may be included in the display device 10 for the convenience of description, a switching thin film transistor or a capacitor may also be included in the display device. Further, in FIG. 7, even though it is described that the thin film transistor 220 has a coplanar structure, a staggered thin film transistor may also be used.

The overcoating layer 213 is formed on the thin film transistor 220. The overcoating layer 213 planarizes an upper portion of the thin film transistor 220. The overcoating layer 213 may be formed of an organic insulating material such as acrylic resin.

The organic light emitting diode 230 is disposed on the overcoating layer 213. The organic light emitting diode 230 includes an anode 231, an organic layer 232, and a cathode 233.

Specifically, the anode 231 is disposed on the overcoating layer 213 and is electrically connected to one of the source electrode and the drain electrode of the thin film transistor 220 through a contact hole of the overcoating layer 213. Since the display panel 200 is a top emission type organic light emitting display panel, the anode 231 may include a transparent conductive layer formed of a transparent conductive material and a reflective layer formed of a metal material having excellent reflectivity below the transparent conductive layer. However, a structure of the anode 231 is not limited thereto.

The bank 214 is disposed to cover both ends of the anode 231. The bank 214 may define an emission area, or an area of the anode 231 which is not covered by the bank 214 may be defined as an emission area.

The organic layer 232 is disposed on the anode 231 and the bank 214. The organic layer 232 may have a structure in which a hole injecting layer HIL, a hole transport layer HTL, an organic light emitting layer EML, an electron transport layer ETL, and an electron injecting layer EIL are sequentially laminated. Further, the organic layer 232 may have a structure in which a plurality of light emitting units each having an organic light emitting layer EML is laminated.

The cathode 233 is disposed on the organic layer 232. Since the display panel 200 is a top emission type organic light emitting display panel, the cathode 233 may be formed of a metal material having a very thin thickness or formed of a transparent conductive material.

The encapsulation unit 215 is disposed on the organic light emitting diode 230. The encapsulation unit 215 is a configuration for protecting the organic light emitting diode 230 from permeation of moisture or oxygen. The encapsulation unit 215 may be formed of an inorganic layer or formed of a structure in which inorganic layers and organic layers are alternately laminated.

A buffer layer 201 is disposed on the display panel 200 and the touch panel 100 is disposed on the buffer layer 201. The buffer layer 201 insulates the display panel 200 and the touch panel 100 from each other and serves as a base member in which the plurality of first sensing electrodes 113 of the touch panel 100 is disposed. The buffer layer 201 may comprise silicon oxide (SiOx), silicon nitride (SiNx), or multi-layers thereof, but is not limited thereto.

The plurality of driving electrodes 111, the electroactive layer 112, the plurality of first sensing electrodes 113, the insulating layer 130, and the plurality of second sensing electrodes 123 are sequentially laminated on the buffer layer 201 to configure the touch panel 100. In this case, the touch panel 100 is not separately formed to be disposed on the display panel 200, but may be directly formed on the display panel 200. However, it is not limited thereto and the display panel 200 and the touch panel 100 may be separately formed and then bonded by an adhesive layer to form the display device 10. In this case, the touch driver 13 may be disposed not on the display panel 200, but on the touch panel 100.

Figure 8:
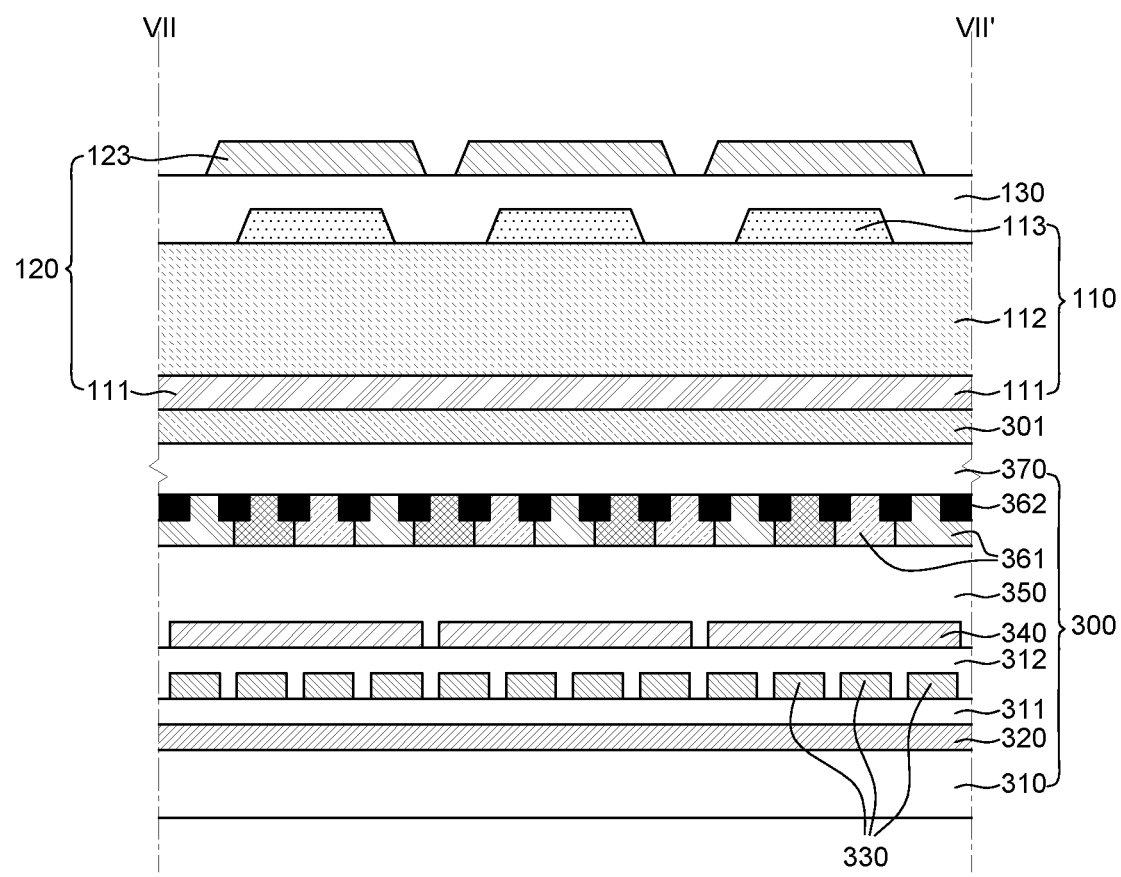
FIG. 8 is a schematic cross-sectional view of a display device according to another exemplary embodiment of the present disclosure.

FIG. 8 is a schematic cross-sectional view of a display device according to another exemplary embodiment of the present disclosure. A display device 20 of FIG. 8 is substantially the same as the display device 10 of FIGS. 6 and 7 except that a display panel 300 is a liquid crystal display panel, and a redundant description will be omitted.

Referring to FIG. 8, a display device 20 includes a display panel 300 and a touch panel 100. The display panel 300 may be a liquid crystal display panel which includes a first substrate 310, a gate line 320, a first insulating layer 311, a data line 330, a second insulating layer 312, a pixel electrode, a common electrode 340, a liquid crystal layer 350, a color filter 361, a black matrix 362, and a second substrate 370. In the meantime, even though not illustrated in FIG. 8, the display panel 300 may further include a backlight unit which supplies light to the liquid crystal layer 350 and is disposed below the first substrate 310.

The first substrate 310 is a substrate which supports various components of the display panel 300. Various wiring lines and a driving element for driving the display panel 300 may be disposed on the first substrate 310. The first substrate 310 may be formed of glass or a plastic having flexibility.

The gate line 320 is disposed on the first substrate 310. Even though not illustrated in FIG. 8, a plurality of gate lines 320 may be provided. The first insulating layer 311 which protects the gate lines 320 and insulates the gate lines 320 from other components is disposed on the gate line 320.

A plurality of data lines 330 is disposed on the first insulating layer 311. The plurality of data lines 330 may be disposed to intersect the plurality of gate lines 320. The second insulating layer 312 which protects the plurality of data lines 330 and planarizes the upper portion of the plurality of data lines 330 is disposed on the plurality of data lines 330.

Even though not illustrated in FIG. 8, a common voltage line which overlaps the data lines 330 and applies a common voltage to the common electrode 340 may be further disposed. Further, the thin film transistor which is electrically connected to the gate line 320 to be turned on/off by a signal from the gate line 320 and transmits the signal from the data line 330 to the pixel electrode may be disposed on the first substrate 310. However, the arrangement and the configuration of various wiring lines and the driving element of the display panel 300 as described above is illustrative, and the present disclosure is not limited thereto.

The pixel electrode and the common electrode 340 are disposed on the second insulating layer 312. The common electrode 340 is configured to be electrically connected to the common voltage line to be applied with a common voltage and the pixel electrode is configured to be electrically connected to the thin film transistor to be applied with a data voltage. In the meantime, even though not specifically illustrated in FIG. 8, the pixel electrode may be alternately disposed to be parallel to the common electrode 340 on the same plane or may be formed to be spaced apart from the common electrode 340 with an insulating layer therebetween.

The liquid crystal layer 350 is disposed on the common electrode 340. An alignment of the liquid crystal of the liquid crystal layer 350 is changed by an electric field which is generated when a data voltage and a common voltage are applied to the pixel electrode and the common electrode 340, respectively. The display panel 300 adjusts the alignment of the liquid crystal by the above-described method so that the image may be displayed by adjusting transmittance of light which is irradiated from the backlight unit.

The second substrate 370 is disposed on the liquid crystal layer 350. In this case, the color filter 361 and the black matrix 362 are disposed between the second substrate 370 and the liquid crystal layer 350. The second substrate 370 is a substrate which supports the components formed in the second substrate 370, such as the color filter 361 and the black matrix 362. The second substrate 370 is disposed to be opposite to the first substrate 310. The second substrate 370 may be formed of glass or a plastic having flexibility.

The color filter 361 converts light which passes through the liquid crystal layer 350 into light having a specific color, and for example, may be configured by a red color filter, a green color filter, and a blue color filter. Even though in FIG. 8, it is illustrated that the color filter 361 and the black matrix 362 are disposed on the second substrate 370, but embodiments of the display device 20 are not limited thereto and the color filter 361 and the black matrix 362 may be disposed on the first substrate 110.

A buffer layer 301 is disposed on the display panel 300 and the touch panel 100 is disposed on the buffer layer 301. The buffer layer 301 insulates the display panel 300 and the touch panel 100 from each other and serves as a base member in which the plurality of first sensing electrodes 113 of the touch panel 100 is disposed. The buffer layer 301 may comprise silicon oxide (SiOx), silicon nitride (SiNx), or multi-layers thereof, but is not limited thereto.

The plurality of driving electrodes 111, the electroactive layer 112, the plurality of first sensing electrodes 113, the insulating layer 130, and the plurality of second sensing electrodes 123 are sequentially laminated on the buffer layer 301 to configure the touch panel 100. In this case, the touch panel 100 is not separately formed to be disposed on the display panel 300, but may be directly formed on the display panel 300. However, it is not limited thereto and the display panel 300 and the touch panel 100 are separately formed and then bonded by an adhesive layer to form the display device 20.

The exemplary embodiments of the present disclosure can also be described as follows:

According to an aspect of the present disclosure, there is provided a touch panel. The touch panel includes a plurality of first electrodes which extends in a first direction. The touch panel further includes an electroactive layer which is disposed on the plurality of first electrodes and is formed of an electroactive material. The touch panel further includes a plurality of second electrodes which is disposed on the electroactive layer and extends in a second direction which is different from the first direction. The touch panel further includes an insulating layer which is disposed to cover the electroactive layer and the plurality of second electrodes. The touch panel further includes a plurality of third electrodes which is disposed on the insulating layer and extends in the second direction.

Each of the plurality of third electrodes may overlap at least one of the plurality of second electrodes.

An area of each of the plurality of second electrodes may be smaller than an area of each of the plurality of third electrodes.

Each of the plurality of second electrodes may include a plurality of sub electrodes overlapping the plurality of first electrodes and a bridge electrode which connects the plurality of sub electrodes.

The sub electrodes may have a circular shape or a polygonal shape.

According to another aspect of the present disclosure, there is provided a touch panel. The touch panel includes a first touch sensor unit which senses a touch position and a touch force. The touch panel includes a second touch sensor unit which senses a change in the touch force. The first touch sensor unit includes an electroactive layer which is formed of an electroactive material, a plurality of driving electrodes disposed on one surface of the electroactive layer, and a plurality of first sensing electrodes disposed on the other surface of the electroactive layer. The second touch sensor unit includes the plurality of driving electrodes and a plurality of second sensing electrodes which is disposed on the plurality of first sensing electrodes and is insulated from the plurality of first sensing electrodes.

The first touch sensor unit may senses the touch position and the touch force by piezoelectric type sensing and the second touch sensor unit senses the change in the touch force by capacitive type sensing.

The touch panel may further include a first read-out IC which is connected to the plurality of first sensing electrodes. The touch panel may further include a second read-out IC which is connected to the plurality of second sensing electrodes. The first read-out IC may detect the touch position and the touch force based on a voltage which is generated in the electroactive layer and is transmitted through the plurality of first sensing electrodes. The second read-out IC may detect the change in the touch force based on the change of capacitance in the plurality of second sensing electrodes.

A driving signal may be applied to the driving electrode during a touch sensing period and the first read-out IC and the second read-out IC simultaneously detect the touch position and the touch force and the change in the touch force during the touch sensing period.

A driving signal may be applied to the driving electrode during a touch sensing period, the first read-out IC detects the touch position and the touch force during a first touch sensing period of the touch sensing period, and the second read-out IC detects the change in the touch force during a second touch sensing period which is different from the first touch sensing period of the touch sensing period.

The plurality of driving electrodes may extend in a first direction and the plurality of first sensing electrodes and the plurality of second sensing electrodes extend in the second direction which is different from the first direction.

According to yet another aspect of the present disclosure, there is provided a display device. The display device includes a display panel. The display device further includes a touch panel disposed above or below the display panel. The touch panel includes a plurality of first electrodes which extends in the first direction. The touch panel further includes an electroactive layer which is disposed on the plurality of first electrodes and is formed of an electroactive material. The touch panel further includes a plurality of second electrodes which is disposed on the electroactive layer and extends in a second direction which is different from the first direction. The touch panel further includes an insulating layer which is disposed to cover the electroactive layer and the plurality of second electrodes. The touch panel further includes a plurality of third electrodes which is disposed on the insulating layer and extends in the second direction.

The display device may further include a buffer layer between the display panel and the touch panel. The display panel may include an organic light emitting diode and an encapsulation unit on the organic light emitting diode and the touch panel is disposed on the buffer layer.

The display device may further include a buffer layer between the display panel and the touch panel. The display panel may include a first substrate on which a thin film transistor is disposed and a second substrate on which a color filter is disposed, where the touch panel is disposed on the buffer layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A touch panel, comprising:
   an electroactive layer;
   a plurality of driving electrodes on one side of the electroactive layer, the driving electrodes configured to transmit a driving signal;
   a first touch sensor unit comprising a plurality of first sensing electrodes on another side of the electroactive layer and the plurality of driving electrodes, the first sensing electrodes configured to transmit voltage signals generated responsive to deformation of the electroactive layer; and
   a second touch sensor unit comprising a plurality of second sensing electrodes on the other side of the electroactive layer and the plurality of driving electrodes, the second sensing electrodes spaced apart from the plurality of first sensing electrodes and the plurality of driving electrodes, the second sensing electrodes configured to transmit capacitance signals indicating a change in capacitance between the driving electrodes and the second sensing electrodes,
   wherein the first touch sensor unit is a piezoelectric type touch sensor and the second touch sensor unit is a capacitive type touch sensor,
   wherein the plurality of driving electrodes extend in a first direction and the plurality of first sensing electrodes and the plurality of second sensing electrodes extend in a second direction different from the first direction,
   wherein each of the plurality of first sensing electrodes includes a plurality of sub electrodes overlapping the plurality of driving electrodes and a plurality of bridge electrodes which connect the plurality of sub electrodes,
   wherein a width of the plurality of sub electrodes in the first direction is larger than a width of the plurality of bridge electrodes in the first direction.

2. The touch panel according to claim 1, wherein each of the plurality of second sensing electrodes overlaps at least one of the plurality of first sensing electrodes.

3. The touch panel according to claim 1, wherein an area of each of the plurality of first sensing electrodes is smaller than an area of each of the plurality of second sensing electrodes.

4. The touch panel according to claim 1, wherein the sub electrodes have a circular shape or a polygonal shape.

5. The touch panel according to claim 1, further comprising an insulating layer disposed between the plurality of first sensing electrodes and the plurality of second sensing electrodes.

6. The touch panel according to claim 1, wherein the voltage signals are processed to determine touch positions and touch forces on the touch panel.

7. The touch panel according to claim 1, further comprising:
   a first read-out integrated circuit (IC) connected to the plurality of first sensing electrodes, the first read-out IC configured to detect a touch position and a touch force by processing the voltage signals; and
   a second read-out IC connected to the plurality of second sensing electrodes, the second read-out IC configured to process the capacitance signals to sense a change in the touch force.

8. The touch panel according to claim 7, wherein the driving signal is applied during a touch sensing period, and wherein the touch position, the touch force, and the change in the touch force are simultaneously detected by the first read-out IC and the second read-out IC during the touch sensing period.

9. The touch panel according to claim 7, wherein the driving signal is applied during a touch sensing period, wherein the touch position and the touch force are detected by the first read-out IC during a first touch sensing period of the touch sensing period, and the change in the touch force is detected by the second read-out IC during a second touch sensing period different from the first touch sensing period.

10. A display device, comprising:
    a display panel; and
    a touch panel disposed above or below the display panel, the touch panel comprising:
      an electroactive layer;
      a plurality of driving electrodes on one side of the electroactive layer, the driving electrodes configured to transmit a driving signal;
      a first touch sensor unit comprising a plurality of first sensing electrodes disposed on another side of the electroactive layer and the plurality of driving electrodes, the first sensing electrodes configured to transmit voltage signals generated responsive to deformation of the electroactive layer; and
      a second touch sensor unit comprising a plurality of second sensing electrodes disposed on the electroactive layer and the plurality of driving electrodes, the second sensing electrodes spaced apart from the plurality of first sensing electrodes and the plurality of driving electrodes, the second sensing electrodes configured to transmit capacitance signals indicating a change in capacitance between the driving electrodes and the second sensing electrodes,
      wherein the first touch sensor unit is a piezoelectric type touch sensor and the second touch sensor unit is a capacitive type touch sensor,
      wherein the plurality of driving electrodes extend in a first direction and the plurality of first sensing electrodes and the plurality of second sensing electrodes extend in a second direction different from the first direction, wherein each of the plurality of first sensing electrodes includes a plurality of sub electrodes overlapping the plurality of driving electrodes and a plurality of bridge electrodes which connect the plurality of sub electrodes, wherein a width of the plurality of sub electrodes in the first direction is larger than a width of the plurality of bridge electrodes in the first direction.

11. The display device according to claim 10, further comprising:

a buffer layer between the display panel and the touch panel, wherein the display panel includes an organic light emitting diode and an encapsulation unit on the organic light emitting diode and the touch panel is disposed on the buffer layer.

12. A method of operating a touch panel, the touch panel comprising a first touch sensor unit and a second touch sensor unit, the first touch sensor unit comprising a plurality of driving electrodes and a plurality of first sensing electrodes, the second touch sensor unit comprising the plurality of driving electrodes and a plurality of second sensing electrodes, the method comprising:

providing a driving signal through the plurality of driving electrodes disposed on one side of an electroactive layer;

transmitting voltage signals through the plurality of first sensing electrodes on another side of the electroactive layer, the voltage signals indicating a deformation of the electroactive layer; and transmitting capacitance signals through the plurality of second sensing electrodes at the other side the electroactive layer, the second sensing electrodes spaced apart from the plurality of first sensing electrodes and the plurality of driving electrodes, the capacitance signals indicating a change in capacitance between the plurality of driving electrodes and the plurality of second sensing electrodes, wherein the first touch sensor unit is a piezoelectric type touch sensor and the second touch sensor unit is a capacitive type touch sensor, wherein the plurality of driving electrodes extends in a first direction and the plurality of first sensing electrodes and the plurality of second sensing electrodes extend in a second direction different from the first direction, wherein each of the plurality of first sensing electrodes includes a plurality of sub electrodes overlapping the plurality of driving electrodes and a plurality of bridge electrode which connects the plurality of sub electrodes, wherein a width of the plurality of sub electrodes in the first direction is larger than a width of the plurality of bridge electrodes in the first direction.

13. The method of operating the touch panel according to claim 12, wherein each of the plurality of second sensing electrodes overlaps at least one of the plurality of first sensing electrodes.

14. The method according to claim 12, further comprising processing the voltage signals to determine touch positions and touch forces on the touch panel.

15. The method according to claim 12, further comprising:

processing the voltage signals by a first read-out integrated circuit (IC) to detect a touch position and a touch force on the touch panel; and processing the capacitance signals by a second read-out IC to detect a change in the touch force.

16. The method according to claim 15, further comprising applying a driving signal to the plurality of driving electrodes during a touch sensing period, wherein processing of the voltage signals by the first read-out IC and processing of the capacitance signals by the second read-out IC are performed during the touch sensing period.

17. The method according to claim 15, further comprising applying a driving signal to the plurality of driving electrodes during a touch sensing period, wherein processing of the voltage signals by the first read-out IC is performed during a first touch sensing period of the touch sensing period, and processing of the capacitance signals are performed by the second read-out IC during a second touch sensing period different from the first touch sensing period.

* * * * *